(12) United States Patent
Huang et al.

(10) Patent No.: US 11,855,183 B2
(45) Date of Patent: Dec. 26, 2023

(54) METHOD FOR MANUFACTURING SEMICONDUCTOR DEVICE

(71) Applicant: CHANGXIN MEMORY TECHNOLOGIES, INC., Hefei (CN)

(72) Inventors: Wei Huang, Hefei (CN); Xiaodong Luo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 221 days.

(21) Appl. No.: 17/404,087

(22) Filed: Aug. 17, 2021

(65) Prior Publication Data

US 2022/0069103 A1 Mar. 3, 2022

Related U.S. Application Data

(63) Continuation of application No. PCT/CN2021/101434, filed on Jun. 22, 2021.

(30) Foreign Application Priority Data

Aug. 28, 2020 (CN) .......................... 202010887738.X

(51) Int. Cl.
*H01L 29/66* (2006.01)
*H01L 29/40* (2006.01)
*H01L 21/265* (2006.01)
*H01L 21/266* (2006.01)
*H01L 29/06* (2006.01)
*H01L 29/78* (2006.01)

(52) U.S. Cl.
CPC ........ *H01L 29/6659* (2013.01); *H01L 21/266* (2013.01); *H01L 21/26586* (2013.01); *H01L 29/0684* (2013.01); *H01L 29/401* (2013.01); *H01L 29/6656* (2013.01); *H01L 29/66492* (2013.01); *H01L 29/7833* (2013.01)

(58) Field of Classification Search
CPC ............. H01L 29/6659; H01L 29/7833; H01L 29/6656; H01L 29/66492; H01L 21/26586; H01L 21/266
See application file for complete search history.

(56) References Cited

U.S. PATENT DOCUMENTS 6,743,680 B1 6/2004 Yu

FOREIGN PATENT DOCUMENTS

| CN | 101179027 A | 5/2008 |
|---|---|---|
| CN | 103972102 A | 8/2014 |
| CN | 106158657 A | 11/2016 |

(Continued)

*Primary Examiner* — Joseph C. Nicely
(74) *Attorney, Agent, or Firm* — Cooper Legal Group, LLC

(57) ABSTRACT

A method for manufacturing a semiconductor device, including: acquiring a substrate, wherein a gate structure is formed on the substrate; implanting first ions into the substrate to form pre-amorphized regions at two sides of the gate structure respectively; implanting second ions into the pre-amorphized regions to form amorphized regions in the pre-amorphized regions respectively; forming first sidewalls each at a respective one of the two sides of the gate structure; performing a second doping process to form first doped regions in the amorphized regions; forming second sidewalls each at a side of a respective first sidewall; and forming a heavily-doped source region and a heavily-doped drain region in the first doped regions respectively.

10 Claims, 5 Drawing Sheets

(56) References Cited

FOREIGN PATENT DOCUMENTS

| | | | |
|---|---|---|---|
| CN | 106558491 A | 4/2017 | |
| CN | 109065456 A | 12/2018 | |
| JP | 2006261232 A | 9/2006 | |
| KR | 100873814 B1 * | 12/2008 | ......... H01L 29/6659 |
| KR | 2009089172 A * | 8/2009 | ....... H01L 29/66492 |

* cited by examiner

METHOD FOR MANUFACTURING SEMICONDUCTOR DEVICE

CROSS-REFERENCE TO RELATED APPLICATIONS

This application is a continuation of International Application No. PCT/CN2021/101434, filed on Jun. 22, 2021, which claims priority to Chinese Patent Application No. 202010887738.X, filed to the China National Intellectual Property Administration on Aug. 28, 2020, entitled "METHOD FOR MANUFACTURING SEMICONDUCTOR DEVICE". The contents of International Application No. PCT/CN2021/101434 and Chinese Patent Application No. 202010887738.X are incorporated herein by reference in their entireties.

BACKGROUND

With the reduction of feature size of the semiconductor processes, the size and width of source and drain active regions of a transistor continuously reduce, resulting in continuous increase of a series resistance of the active region of the device and a contact resistance of a single contact hole. In order to reduce the series resistance of the active region and the contact resistance, after source and drain ion implantation is completed, a metal layer is deposited on a polysilicon gate and the active region by physical vapor deposition, and then thermal treatment is performed to make the metal layer react with silicon in the active region and the polysilicon gate, so as to form a metal silicide on surfaces of the active region and the polysilicon.

Compared with self-aligned metal silicide in a logic chip manufacturing process, in a typical process of manufacturing a Dynamic Random Access Memory (DRAM), after a source region and a drain region of a metal oxide semiconductor (MOS) transistor in a peripheral region are formed through source and drain ion implantation, photoetching and etching processes are firstly performed to form a tungsten contact hole in a substrate of the source region and the drain region, and then the metal silicide and metal tungsten are deposited in the tungsten contact hole. A distance between the metal silicide and an edge of the drain region is affected by the feature size of a gate, the feature size of the photoetching process of the tungsten contact hole as well as the deviation in alignment between the tungsten contact hole and the gate. As the integration degree of the semiconductor devices continuously increases, the size of the gate gradually reduces, the distance between the metal silicide and the edge of the drain region reduces and the junction leakage current gradually increases, thus affecting the performance and power consumption of the semiconductor devices.

SUMMARY

The disclosure relates to the technical field of integrated circuits, and in particular to a method for manufacturing a semiconductor device.

The method for manufacturing the semiconductor device may include: acquiring a substrate, wherein a gate structure is formed on the substrate; forming a first mask pattern on the substrate using a mask plate, wherein the first mask pattern exposes a preset source region and a preset drain region located at two sides of the gate structure respectively; implanting first ions into the preset source region and the preset drain region by taking the first mask pattern as a first mask, to form pre-amorphized regions; implanting second ions into the pre-amorphized regions to form amorphized regions; forming first sidewalls each at a respective one of the two sides of the gate structure; forming a second mask pattern on the substrate using the mask plate; performing a first doping process on the amorphized regions by taking the second mask pattern and the first sidewalls as a second mask, to form first doped regions respectively; forming second sidewalls each at a side of a respective first sidewall; forming a third mask pattern on the substrate using the mask plate; and performing a second doping process on the first doped regions by taking the third mask pattern, the first sidewalls and the second sidewalls as a third mask, to form a heavily-doped source region and a heavily-doped drain region respectively.

A semiconductor device manufactured by a method, the method including: acquiring a substrate, wherein a gate structure is formed on the substrate; forming a first mask pattern on the substrate using a mask plate, wherein the first mask pattern exposes a preset source region and a preset drain region located at two sides of the gate structure respectively; implanting first ions into the preset source region and the preset drain region by taking the first mask pattern as a first mask, to form pre-amorphized regions; implanting second ions into the pre-amorphized regions to form amorphized regions; forming first sidewalls each at a respective one of the two sides of the gate structure; forming a second mask pattern on the substrate using the mask plate; performing a first doping process on the amorphized regions by taking the second mask pattern and the first sidewalls as a second mask, to form first doped regions respectively; forming second sidewalls each at a side of a respective first sidewall; forming a third mask pattern on the substrate using the mask plate; and performing a second doping process on the first doped regions by taking the third mask pattern, the first sidewalls and the second sidewalls as a third mask, to form a heavily-doped source region and a heavily-doped drain region respectively.

An electronic apparatus, including a semiconductor device manufactured by a method, the method including: acquiring a substrate, wherein a gate structure is formed on the substrate; forming a first mask pattern on the substrate using a mask plate, wherein the first mask pattern exposes a preset source region and a preset drain region located at two sides of the gate structure respectively; implanting first ions into the preset source region and the preset drain region by taking the first mask pattern as a first mask, to form pre-amorphized regions; implanting second ions into the pre-amorphized regions to form amorphized regions; forming first sidewalls each at a respective one of the two sides of the gate structure; forming a second mask pattern on the substrate using the mask plate; performing a first doping process on the amorphized regions by taking the second mask pattern and the first sidewalls as a second mask, to form first doped regions respectively; forming second sidewalls each at a side of a respective first sidewall; forming a third mask pattern on the substrate using the mask plate; and performing a second doping process on the first doped regions by taking the third mask pattern, the first sidewalls and the second sidewalls as a third mask, to form a heavily-doped source region and a heavily-doped drain region respectively.

BRIEF DESCRIPTION OF THE DRAWINGS

In order to illustrate the technical solutions of the embodiments of the disclosure or the traditional technology more clearly, the accompanying drawings required for describing the embodiments or the traditional technology will be described briefly in the following. It is apparent that the accompanying drawings in the following description depict only some embodiments of the disclosure, and a person of ordinary skill in the art may still derive other drawings from these accompanying drawings without creative efforts.

DETAILED DESCRIPTION

Figure 1:
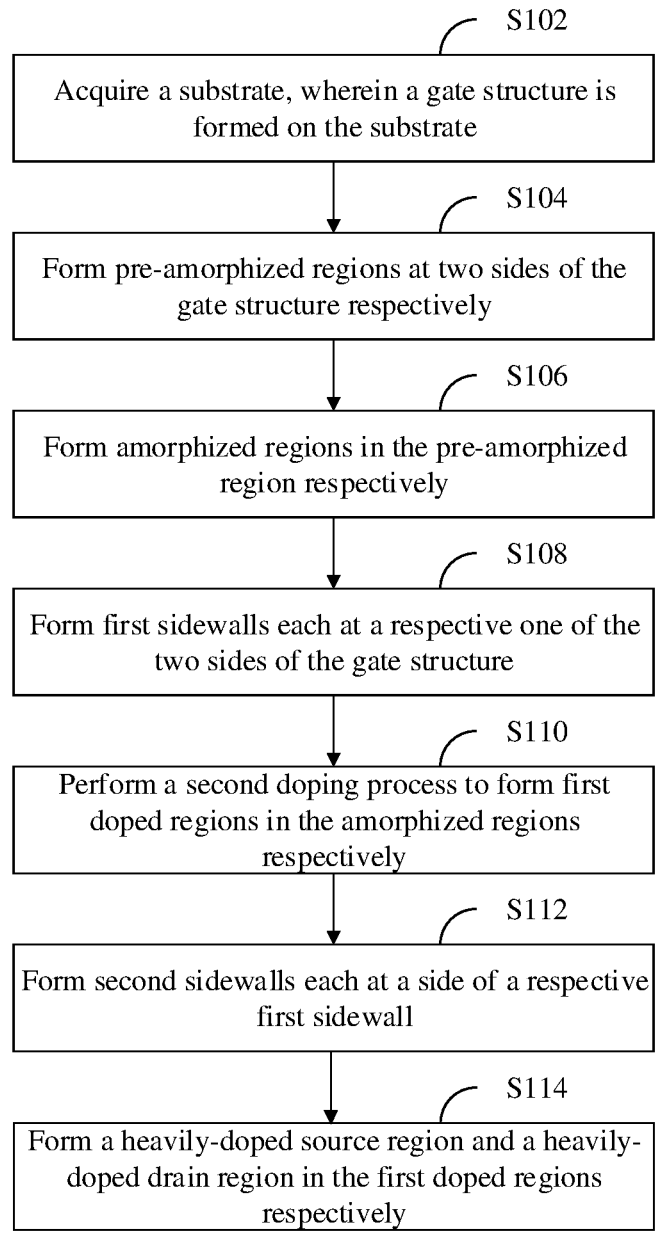
FIG. 1 illustrates a flow chart of a method for manufacturing a semiconductor device in an embodiment.

In order to facilitate the understanding of the disclosure, the disclosure will now be described more fully hereinafter with reference to the related drawings. The embodiments of the disclosure are illustrated in the drawings. The disclosure may, however, be embodied in many different forms which are not limited to the embodiments described herein. Rather, these embodiments are provided so that the disclosure content of the disclosure will be thorough and complete.

Unless defined otherwise, all technical and scientific terms used herein have the same meaning as commonly understood by those skilled in the art to which the disclosure belongs. The terms used herein in the specification of the disclosure is for the purpose of describing specific embodiments only and is not intended to be limiting of the disclosure.

It should be understood that when an element or layer is referred as "on", "adjacent to", "connected to" or "coupled to" another element or layer, it may be directly on, adjacent to, or connected to or coupled to the another element or layer, or there may be an intermediate element or layer. In contrast, when an element is referred as "directly on", "directly adjacent to", "directly connected to" or "directly coupled to" another element or layer, there is no intermediate element or layer. It should be understood that although the terms "first", "second", "third" and the like may be used to describe various elements, components, regions, layers, doping types and/or parts, these elements, components, regions, layers, doping types and/or parts should not be limited by these terms. These terms are only used to distinguish one element, component, region, layer, doping type or part from another element, component, region, layer, doping type or part. Therefore, without departing from the teaching of the disclosure, a first element, component, region, layer, doping type or part discussed below may be expressed as a second element, component, region, layer or part. For example, a first doping type may be referred as a second doping type, and similarly, the second doping type may be referred as the first doping type. The first doping type and the second doping type are different doping types. For example, the first doping type may be a P type and the second doping type may be an N type, or the first doping type may be the N type and the second doping type may be the P type.

Spatial relationship terms such as "beneath", "below", "lower", "under", "above" or "upper" may be used herein to describe a relationship between one element or feature and another element or feature shown in the figures. It should be understood that besides the orientations shown in the drawings, the spatial relationship terms further include different orientations of devices in use and operation. For example, if the devices in the drawings are turned over, an element or feature described as being "below" or "under" or "beneath" another element will be oriented as being "above" the another element or feature. Therefore, the exemplary terms "below" and "under" may include upward and downward orientations. In addition, the devices may also include other orientations (e.g., rotation for 90 degrees or other orientations), and the spatial descriptors used herein are interpreted accordingly.

As used herein, the singular forms "a", "an", "one" and "the" may include the plural forms as well, unless it is otherwise indicated clearly in the context. It should also be understood that the terms "comprising/including" or "having" and the like specify the presence of stated features, integrals, steps, operations, components, portions or combinations thereof, but do not preclude the possibility of the presence or addition of one or more other features, integrals, steps, operations, components, parts or combinations thereof. Also, in the specification, the term "and/or" includes any and all combinations of the associated listed items.

The embodiments of the disclosure are described herein with reference to cross-sectional views that are schematic views of ideal embodiments (and intermediate structures) of the disclosure, such that variations in the shown shapes caused by, for example, manufacturing technologies and/or tolerances may be expected. Therefore, the embodiments of the disclosure should not be limited to the particular shapes of regions shown herein, but include shape variations caused by, for example, manufacturing technologies. For example, implanted regions shown as rectangles typically have rounded or curved features and/or implantation concentration gradients at their edges rather than binary changes from implanted regions to non-implanted regions. Also, a buried region formed by implantation may result in some implantations in a region between the buried region and a surface through which the implantation is performed. Therefore, the regions illustrated in the drawings are schematic substantially and their shapes do not represent actual shapes of the regions of the devices and does not limit the scope of the disclosure.

A metal silicide is a metal compound formed through chemical reaction between a metal and silicon, and has a conductive characteristic between those of the metal and the silicon. A typical metal silicide process is to form the metal silicide by metal reacting with silicon in an active region and a polysilicon gate in direct contact with the metal. The metal will not react with dielectric materials in contact such as $SiO_2$, $Si_3N_4$ and SiON. Therefore, the metal silicide formed on surfaces of the active region and the polysilicon gate can be well aligned with the active region and the polysilicon gate, and a technology of forming the metal silicide on the active region and the polysilicon gate is referred as Self Aligned Silicide (Salicide).

In the DRAM process, the metal silicide in a source region and a drain region of an MOS transistor in a peripheral region is partially located in contact holes formed in a substrate of the source region and the drain region. As the integration degree of the semiconductor devices continuously increases, the size of the gate gradually reduces, a distance between the metal silicide and an edge of the drain region reduces and the junction leakage current gradually increases.

As illustrated in FIG. 1, in an embodiment, a method for manufacturing a semiconductor device is provided, including the following actions.

At S102, a substrate is acquired. A gate structure is formed on the substrate.

The substrate may be a silicon substrate, a Silicon On Insulator (SOI) substrate, a Stacked Silicon On Insulator (SSOI) substrate, a Stacked Silicon Germanium On Insulator (S—SiGeOI) substrate, a Silicon Germanium On Insulator (SiGeOI) substrate, a Germanium On Insulator (GeOI) substrate or the like.

In an embodiment, the gate structure includes a gate dielectric layer and a gate conductive layer located on the gate dielectric layer. The gate dielectric layer may be Silicon Oxide ($SiO_2$) or Silicon Oxynitride (SiNO). At a process node of 65 nm or below, a feature size of the gate structure is very small, and the gate dielectric layer is preferably a material with high dielectric constant (high-k). The high-k material includes hafnium oxide, hafnium silicon oxide, hafnium silicon oxynitride, lanthanum oxide, zirconium oxide, zirconium silicon oxide, titanium oxide, tantalum oxide, barium strontium titanium oxide, barium titanium oxide, strontium titanium oxide, aluminum oxide and the like. The high-k material is hafnium oxide, zirconium oxide and aluminum oxide in ideal embodiments. A process of forming the gate dielectric layer may adopt any existing technology known to those skilled in the art, such as the chemical vapor deposition method.

In an embodiment, the gate structure includes a gate oxide layer, a polysilicon layer, a titanium nitride layer, a tungsten metal layer and a silicon nitride layer successively from the substrate to the top.

At S104, pre-amorphized regions are formed at two sides of the gate structure respectively.

A first mask pattern is formed on the substrate using a mask plate. The first mask pattern exposes a preset source region and a preset drain region located at the two sides of the gate structure respectively. The mask plate defines a lightly-doped region, namely a lightly-doped drain (LDD) photo. The first mask pattern is formed on the substrate through the LDD photo, and the first mask pattern exposes the preset source region and the preset drain region located at the two sides of the gate structure respectively. First ions are implanted into the preset source region and the preset drain region by taking the first mask pattern as a first mask, to form pre-amorphized regions. The pre-amorphized regions are located at the two sides of the gate structure respectively.

At S106, amorphized regions are formed in the pre-amorphized regions.

Second ions are implanted into the pre-amorphized regions by taking the first mask pattern as a mask, to form amorphized regions.

At S108, first sidewalls are formed, each at a respective one of the two sides of the gate structure.

At S110, a first doping process is performed to form first doped regions in the amorphized regions respectively.

Firstly, a second mask pattern is formed on the substrate using the mask plate. That is, the second mask pattern is formed on the substrate using the mask plate for forming the first mask pattern. The second mask pattern exposes the preset source region and the preset drain region located at the two sides of the gate structure and the first sidewalls located at the two sides of the gate structure in the preset source region and the preset drain region.

Secondly, the second doping process is performed on the amorphized regions by taking the second mask pattern and the first sidewalls as a second mask, to form the first doped regions respectively.

At S112, second sidewalls are formed, each at a side of a respective first sidewall.

At S114, a heavily-doped source region and a heavily-doped drain region are formed in the first doped regions respectively.

Firstly, a third mask pattern is formed on the substrate using the mask plate. That is, the third mask pattern is formed on the substrate using the mask plate for forming the first mask pattern. The third mask pattern exposes the preset source region and the preset drain region located at the two sides of the gate structure, as well as the first sidewalls and the second sidewalls located at the two sides of the gate structure in the preset source region and the preset drain region.

Secondly, a second doping process is performed on the first doped regions by taking the third mask pattern, the first sidewalls and the second sidewalls as a third mask, to form the heavily-doped source region and the heavily-doped drain region respectively.

The first mask pattern, the second mask pattern and the third mask pattern are formed through the same mask plate, so that the quantity of photoetching plates used in the process of manufacturing the semiconductor device is reduced and the production cost is saved.

In an embodiment, the first mask pattern, the second mask pattern and the third mask pattern include at least one of a photoresist pattern and a hard mask pattern. Description is made hereinafter with the example that the first mask pattern, the second mask pattern and the third mask pattern are photoresist patterns.

Figure 2:
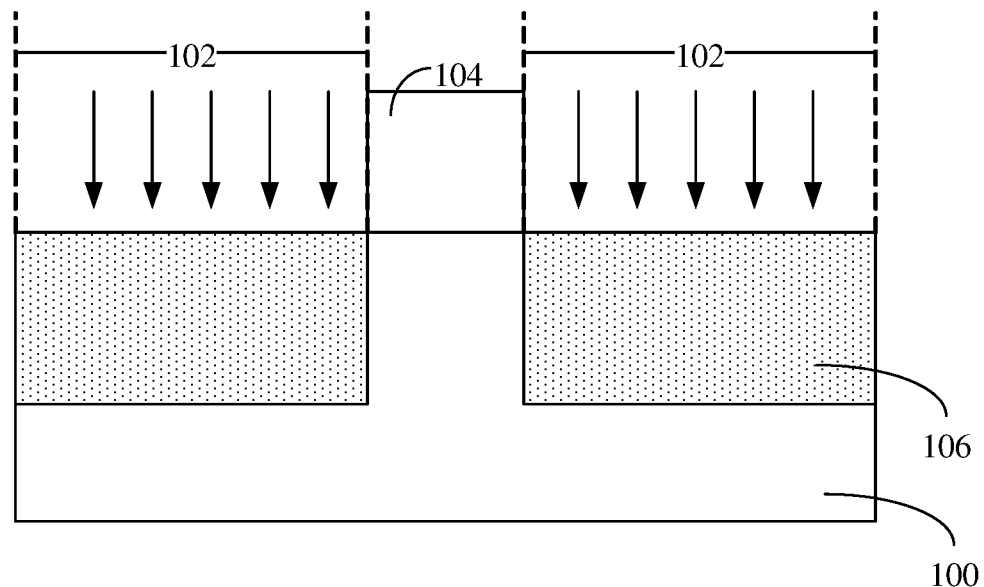
FIG. 2 illustrates a cross-sectional view of a semiconductor device formed with pre-amorphized regions in an embodiment.

FIG. 2 illustrates a cross-sectional view of a semiconductor device formed with pre-amorphized regions in an embodiment.

Firstly, a first photoresist pattern (not shown in the figure) is formed on a substrate 100 using a lightly-doped mask plate. The first photoresist pattern exposes lightly-doped regions 102 located at two sides of a gate structure 104 respectively, namely a preset source region and a preset drain region located at the two sides of the gate structure 104 respectively. Secondly, first ions are implanted into the lightly-doped regions 102 exposed by the first photoresist pattern, to form pre-amorphized regions 106 located in the lightly-doped regions 102. Through implantation of the first ions, the substrate at the pre-amorphized regions is enabled to be in an amorphous state, and an implantation depth and an implantation width of doping ions in subsequent ion implantation of the pre-amorphized regions are reduced.

Figure 3:
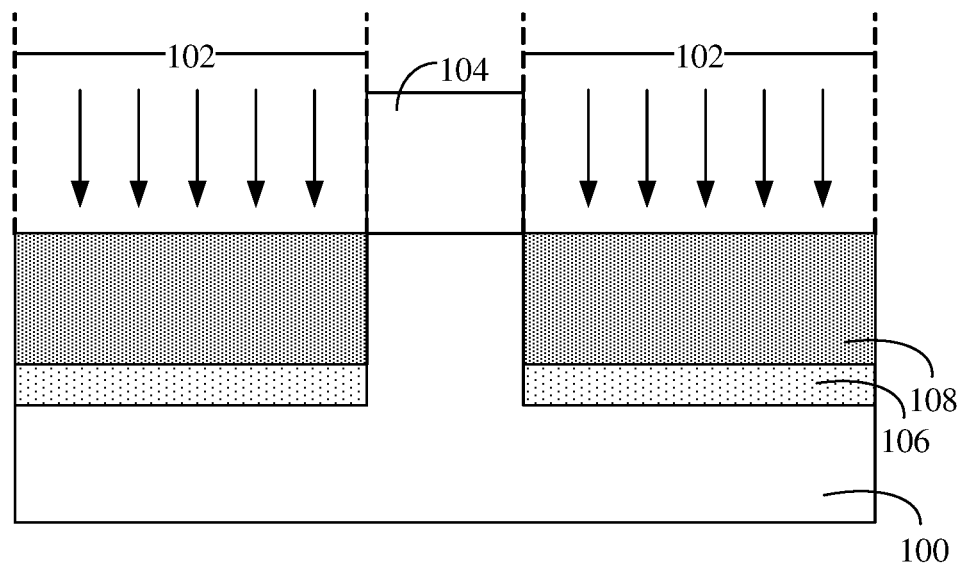
FIG. 3 illustrates a cross-sectional view of a semiconductor device formed with amorphized regions in an embodiment.

FIG. 3 illustrates a cross-sectional view of a semiconductor device formed with amorphized regions in an embodiment.

Action S106 includes the following actions. Firstly, second ions are implanted into the pre-amorphized regions 106 by taking the first photoresist pattern as a mask, to form amorphized regions 108 in the pre-amorphized regions 106. Secondly, the first photoresist pattern on the substrate 100 is removed. When implanting the second ions into the pre-amorphized regions, the implanted second ions will occupy interstitial vacancies between atoms of the substrate in the pre-amorphized regions, so as to inhibit diffusion of doped ions in the doped regions formed in the pre-amorphized regions, and increase an effective distance between a surface of the doped region and an edge of the doped region, so as to achieve the purpose of reducing the junction leakage current.

Figure 4:
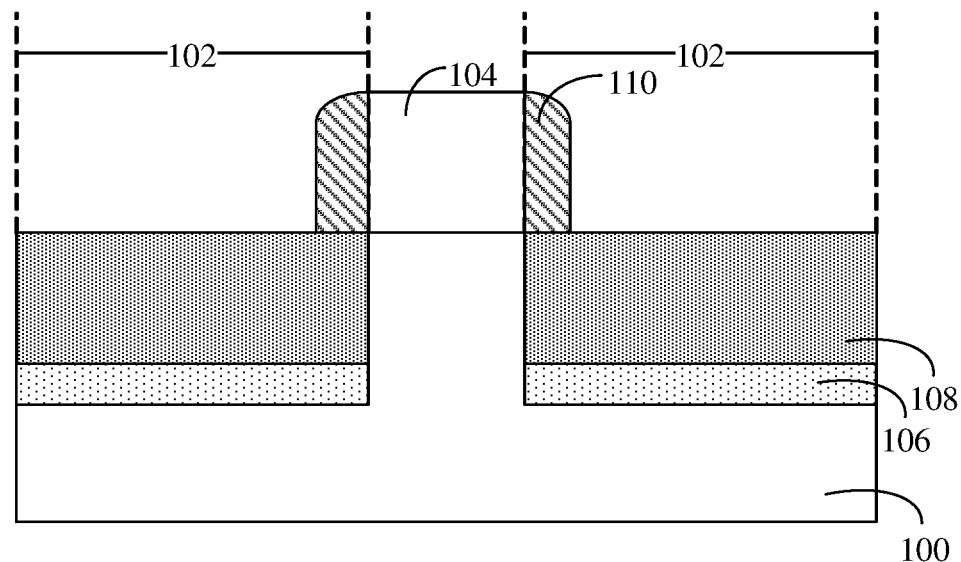
FIG. 4 illustrates a cross-sectional view of a semiconductor device formed with first sidewalls in an embodiment.

As illustrated in FIG. 4, first sidewalls 110 are formed on the substrate 100 at two sides of the gate structure 104 respectively. The first sidewall 110 is located on a partial region of the amorphized region 108 close to the gate structure 104. The first sidewalls 110 may be of an insulating material such as silicon nitride, silicon oxide and silicon oxynitride. In one implementation, the first sidewalls 110 may be a combination of silicon nitride and silicon oxide, furthermore, may be an ON structure constituted by successively formed silicon oxide and silicon nitride, or may be an ONO structure constituted by successively formed silicon oxide, silicon nitride and silicon oxide.

In an embodiment, the action of forming the first sidewalls 110 on the substrate 100 at the two sides of the gate structure 104 respectively includes the following actions. Firstly, first sidewall films are formed on a surface of the substrate 100. Secondly, a photoresist pattern covering the first sidewall films that need to be retained is formed on the surface of the substrate. Thirdly, etching is carried out to remove the first sidewall films exposed by the photoresist pattern, and then the photoresist pattern on the surface of the substrate is removed, so as to obtain the first sidewalls 110 constituted by the remaining first sidewall films.

Figure 5:
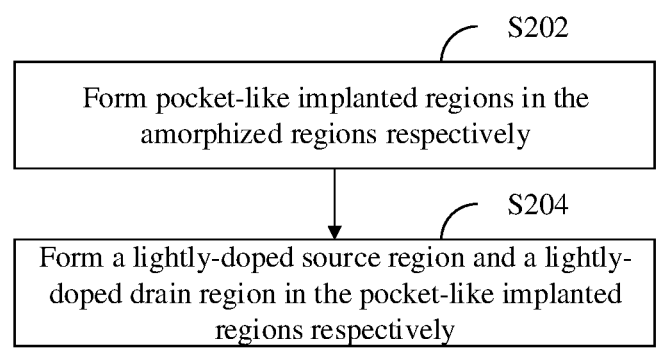
FIG. 5 illustrates a flow chart of forming first doped regions in an embodiment.
Figure 6:
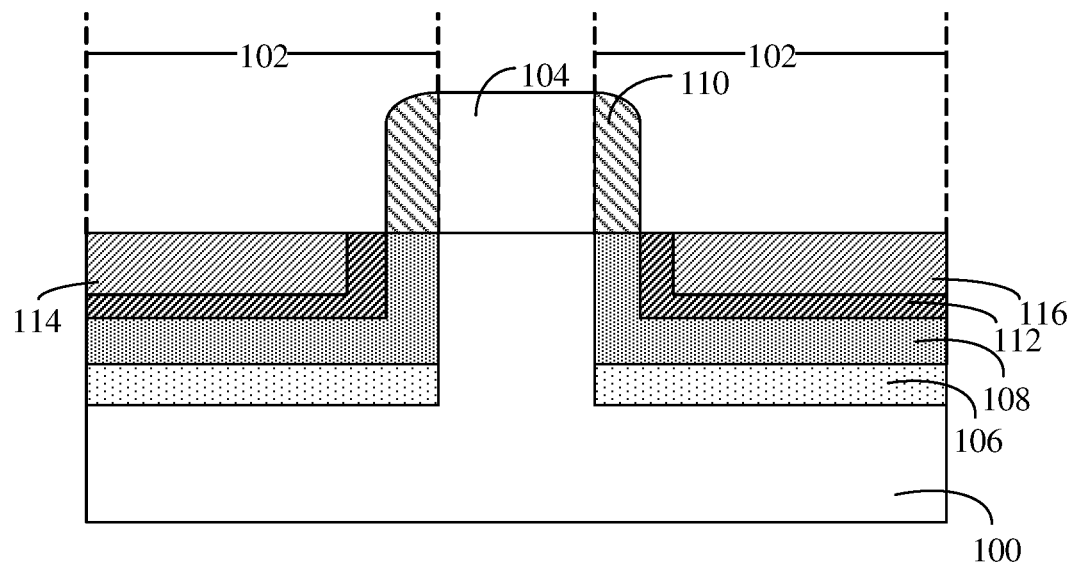
FIG. 6 illustrates a cross-sectional view of a semiconductor device formed with first doped regions in an embodiment.

As illustrated in FIG. 5 and FIG. 6, in an embodiment, the action of performing a first doping process on the amorphized regions by taking the second mask pattern and the first sidewalls as a second mask, to form first doped regions includes the following actions.

At S202, a pocket-like implanted region is formed in each of the amorphized regions.

Third ions are implanted into the amorphized regions 108 by taking the second mask pattern and the first sidewalls 110 as a second mask, to form pocket-like implanted regions 112 in the amorphized regions 108 respectively. The third ions have a doping type opposite to that of the second doping process.

At S204, a lightly-doped source region and a lightly-doped drain region are formed in the pocket-like implanted regions respectively.

Fourth ions are implanted into the pocket-like implanted regions 112 by taking the second mask pattern and the first sidewalls 110 as the second mask, to form a lightly-doped source region 114 and a lightly-doped drain region 116 in the pocket-like implanted regions 112 respectively. The third ions have a doping type opposite to that of the fourth ions. The lightly-doped source region 114 and the lightly-doped drain region 116 are encircled by the pocket-like implanted regions 112 respectively. Depletion regions of the source region and the drain region close to two sides of a channel region are narrowed through the pocket-like implanted regions 112, achieving the purpose of relieving the short channel effect.

The first doped regions include the pocket-like implanted regions 112 as well as the lightly-doped source region 114 and the lightly-doped drain region 116 located in the pocket-like implanted regions 112.

In an embodiment, the third ions are implanted through an angled ion implantation process, and an angle between an implantation direction of the angled ion implantation process and a normal to a surface of the substrate is 10° to 25°, for example, 15 degrees, or 20 degrees.

In an embodiment, the third ions are P-type doping ions, such as boron fluoride ions, boron ions or indium ions. The fourth ions are N-type doping ions, such as phosphonium ions and arsenic ions.

In another embodiment, the third ions are N-type doping ions, and the fourth ions are P-type doping ions.

Figure 7:
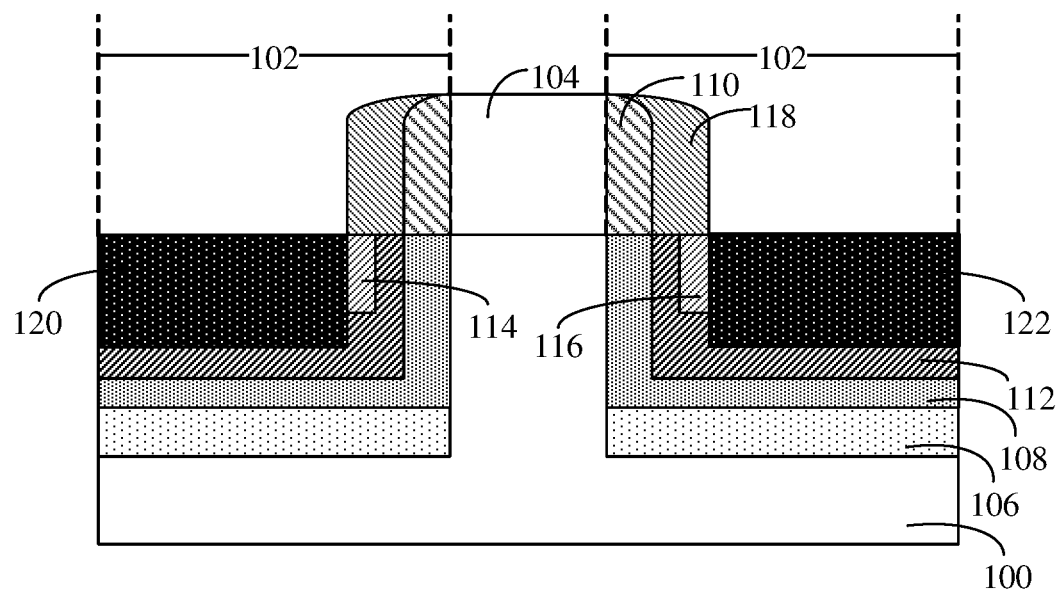
FIG. 7 illustrates a cross-sectional view of a semiconductor device formed with a heavily-doped source region and a heavily-doped drain region in an embodiment.

As illustrated in FIG. 7, second sidewalls 118 are formed each at a side of a respective first sidewall 110. Then a second doping process is performed on the first doped regions to form a heavily-doped source region 120 located in the lightly-doped source region 114 and a heavily-doped drain region 122 located in the lightly-doped drain region 116. In an embodiment, after the heavily-doped source region 120 and the heavily-doped drain region 122 are formed, the method further includes action of forming an interlayer dielectric layer 124 on the substrate 100.

Figure 8:
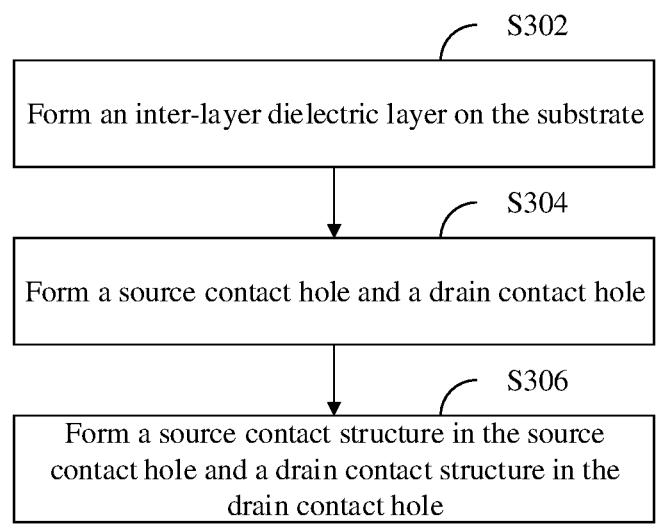
FIG. 8 illustrates a flow chart of a method for manufacturing a semiconductor device in another embodiment.
Figure 9:
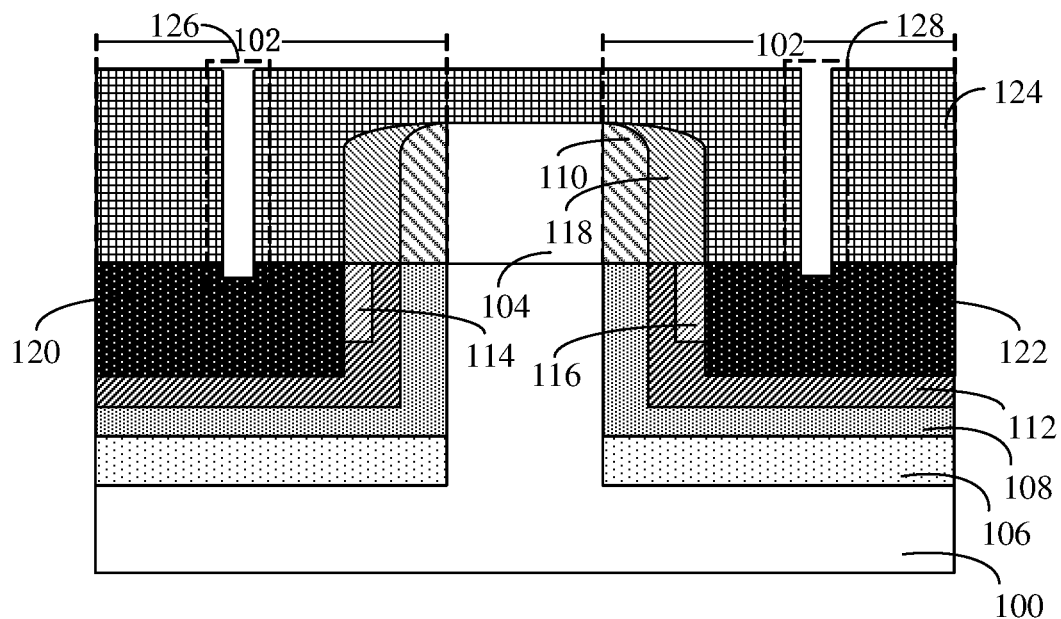
FIG. 9 illustrates a cross-sectional view of a semiconductor device formed with a source contact hole and a drain contact hole in an embodiment.

As illustrated in FIG. 8 and FIG. 9, in an embodiment, the method further includes the following actions.

At S302, an interlayer dielectric layer 124 is formed on the substrate 100.

The interlayer dielectric layer 124 is formed on the substrate 100, and the interlayer dielectric layer 124 is located on the substrate 100 at the heavily-doped source region 120 and the heavily-doped drain region 122, on the first sidewalls 110, on the second sidewalls 118 and on the gate structure 104. A thickness of the interlayer dielectric layer 124 on the heavily-doped drain region 122 is equal to a sum of a thickness of the gate structure 104 and a thickness of the interlayer dielectric layer 124 on the gate structure 104.

In an embodiment, the interlayer dielectric layer 124 includes an oxide layer and a silicon nitride layer.

At S304, a source contact hole and a drain contact hole are formed.

An etching process is performed on the interlayer dielectric layer 124 to form a source contact hole 126 and a drain contact hole 128 in the heavily-doped source region 120 and the heavily-doped drain region 122, respectively. That is, a source contact hole 126 that exposes part of the heavily-doped source region 120 and a drain contact hole 128 that exposes part of the heavily-doped drain region 122 are formed, respectively. In an embodiment, bottoms of the source contact hole 126 and the drain contact hole 128 are respectively in the heavily-doped source region 120 and the heavily-doped drain region 122. That is, the etching process for forming the source contact hole 126 and the drain contact hole 128 is an over etching process, and the purposes of removing the interlayer dielectric layer 124 between the source contact hole 126 and the heavily-doped source region 120 and between the drain contact hole 128 and the heavily-doped drain region 122 is achieved, and the purpose of eliminating residue of the interlayer dielectric layer 124 between the source contact hole 126 and the heavily-doped source region 120 and between the drain contact hole 128 and the heavily-doped drain region 122 caused by process deviations are achieved.

In an embodiment, the source contact hole 126 and the drain contact hole 128 are formed in the heavily-doped source region 120 and the heavily-doped drain region 122 respectively by a wet etching process.

In an embodiment, the source contact hole 126 and the drain contact hole 128 are formed in the heavily-doped source region 120 and the heavily-doped drain region 122 respectively by a dry etching process.

At S306, a source contact structure is formed in the source contact hole and a drain contact structure is formed in the drain contact hole.

In an embodiment, the action S306 includes the following actions.

A source metal silicide and a drain metal silicide are formed in the source contact hole 126 and the drain contact hole 128 respectively. The source contact structure is formed on the source metal silicide and the drain contact structure is formed on the drain metal silicide, respectively.

The pre-amorphized regions, the amorphized regions and the pocket-like implanted regions formed in the substrate play an effect of inhibiting the diffusion of doping ions in the lightly-doped regions. An equivalent distance (as shown in FIG. 9, it is the distance between boundary locations of the lightly-doped drain region 116 and the pocket-like implanted region 112) between a drain metal silicide (not shown in the figure) formed in the drain contact hole located on the heavily-doped drain region 122 and a doping boundary of the drain region (that is a doping boundary of the lightly-doped drain region) is increased. That is, an equivalent distance between the metal silicide in the drain region and the doping boundary of the drain region is increased, and the junction leakage current is substantially reduced.

In an embodiment, the first ions include at least one of: germanium ions, silicon ions, fluorinions, or antimony ions.

In an embodiment, the second ions include at least one of: carbon ions, nitrogen ions, or fluorinions.

In an embodiment, the first ions are implanted at energy greater than or equal to 6 kilo electronvolts and less than or equal to 14 kilo electronvolts, for example, 6.5 kilo electronvolts, 7 kilo electronvolts, 8 kilo electronvolts, 10 kilo electronvolts, 12 kilo electronvolts or the like. An implanted dosage of the first ions is greater than or equal to $1*10^{14}$ atom/cm$^2$ and less than or equal to $5*10^{14}$ atom/cm$^2$, for example, $1.5*10^{14}$ atom/cm$^2$, $2.0*10^{14}$ atom/cm$^2$, $2.5*10^{14}$ atom/cm$^2$, $3*10^{14}$ atom/cm$^2$ and the like.

In an embodiment, the second ions are implanted at energy greater than or equal to 2 kilo electronvolts and less than or equal to 4 kilo electronvolts. An implanted dosage of the second ions is greater than or equal to $1*10^{14}$ atom/cm$^2$ and less than or equal to $5*10^{14}$ atom/cm$^2$, for example, $1.5*10^{14}$ atom/cm$^2$, $2.0*10^{14}$ atom/cm$^2$, $2.5*10^{14}$ atom/cm$^2$, $3*10^{14}$ atom/cm$^2$ and the like.

In an embodiment, doping performed in the second doping process and doping of the fourth ions implanted refers to doping ions of the same type, for example, both are N-type impurity ions or both are P-type impurity ions.

In an embodiment, doping ions of the second doping process and the fourth ions are the same impurity ions.

In an embodiment, an implantation angle of the first ions implanted and the second ions implanted is 0 degree, and the implantation angle refers to an angle between an implantation direction and the normal to a surface of the substrate. The implantation of the first ions and the second ions reduce a depth and a width of ion implantation at both sides of the gate structure and the ion diffusion speed, without affecting the substrate below the gate structure.

The method for manufacturing the semiconductor device may be applied to various Integrated Circuits (IC), for example, a memory circuit, such as a Random Access Memory (RAM), a Synchronous DRAM (SDRAM), a Static RAM (SRAM) or a Read-Only Memory (ROM). Alternatively, the method may also be applied to a logic device, such as Programmable Logic Array (PLA), Application-Specific Integrated Circuit (ASIC), merged DRAM logic integrated circuit (buried DRAM) or radio-frequency circuit.

According to the method for manufacturing the semiconductor device above, the first mask pattern is formed on the substrate using the mask plate, and the first mask pattern exposes the preset source region and the preset drain region located at two sides of the gate structure. Firstly, the first ions are implanted into the preset source region and the preset drain region by taking the first mask pattern as the first mask, to form the pre-amorphized regions at an amorphous state, so as to reduce an implantation depth and an implantation width of ions in the subsequent implantation of the pre-amorphized regions. Then, the second ions are implanted into the pre-amorphized regions, and the second ions may occupy interstitial vacancies between atoms, so as to form the amorphized regions. After performing the second doping process on the amorphized regions to form the first doped regions, lateral and longitudinal diffusion of doped ions in the first doped regions are both inhibited, an effective distance between the heavily-doped drain region and an edge of the drain region is increased, so as to achieve the purposes of reducing the junction leakage current and reducing the influence of reduction of a distance between a metal silicide and the edge of the drain region on the junction leakage current.

In an embodiment, a semiconductor device manufactured by any above manufacturing method is provided.

In an embodiment, the semiconductor device includes a PMOS transistor and a dynamic random access memory device.

In an embodiment, an electronic apparatus including the semiconductor device is provided.

The semiconductor device is manufactured by any manufacturing method above. The pre-amorphized regions at the amorphous state may reduce an implantation depth and an implantation width in subsequent ion implantation of the pre-amorphized regions. Doped ions in the amorphized regions may occupy interstitial vacancies between atoms, so that lateral diffusion and longitudinal diffusion of doped ions in a lightly-doped region are both inhibited, and an effective distance between the heavily-doped drain region and an edge of the drain region is increased, so as to achieve the purposes of reducing the junction leakage current and reducing the influence of reduction of a distance between a metal silicide and the edge of the drain region on the junction leakage current.

In the descriptions of the specification, the description made with reference to the terms "some embodiments", "other embodiments", "ideal embodiments" and the like means that specific features, structures, materials or features described in connection with the embodiment or example are included in at least one embodiment or example of the disclosure. In the specification, the schematic description of the foregoing terms does not necessarily refer to the same embodiment or example.

Various technical features in the foregoing embodiments may be randomly combined. For ease of simple description, not all possible combinations of various technical features in the foregoing embodiments are described. However, as long as the combinations of these technical features do not contradict, they should be regarded as falling within the scope of the specification.

The foregoing embodiments represent only a few implementations of the disclosure, and the descriptions are relatively specific and detailed, but should not be construed as limiting the patent scope of the disclosure. It should be noted that those of ordinary skill in the art may further make variations and improvements without departing from the conception of the disclosure, and these all fall within the protection scope of the disclosure. Therefore, the patent protection scope of the disclosure should be subject to the appended claims.

The invention claimed is:

1. A method for manufacturing a semiconductor device, comprising:
   acquiring a substrate, wherein a gate structure is formed on the substrate;
   forming a first mask pattern on the substrate using a mask plate, wherein the first mask pattern exposes a preset source region and a preset drain region located at two sides of the gate structure respectively;
   implanting first ions into the preset source region and the preset drain region by taking the first mask pattern as a first mask, to form pre-amorphized regions;
   implanting second ions into the pre-amorphized regions to form amorphized regions;
   forming first sidewalls each at a respective one of the two sides of the gate structure;
   forming a second mask pattern on the substrate using the mask plate;
   performing a first doping process on the amorphized regions by taking the second mask pattern and the first sidewalls as a second mask, to form first doped regions respectively;
   forming second sidewalls each at a side of a respective first sidewall;
   forming a third mask pattern on the substrate using the mask plate; and
   performing a second doping process on the first doped regions by taking the third mask pattern, the first sidewalls and the second sidewalls as a third mask, to form a heavily-doped source region and a heavily-doped drain region respectively.

2. The method of claim 1, wherein the performing a first doping process on the amorphized regions by taking the second mask pattern and the first sidewalls as a second mask, to form first doped regions comprises:
   implanting third ions into the amorphized regions by taking the second mask pattern and the first sidewalls as the second mask, to form pocket-like implanted regions; and
   implanting fourth ions into the pocket-like implanted regions by taking the second mask pattern and the first sidewalls as the second mask, to form a lightly-doped source region and a lightly-doped drain region, wherein the third ions have a doping type opposite to a doping type of the fourth ions.

3. The method of claim 2, wherein the third ions are implanted through an angled ion implantation process, and an angle between an implantation direction of the angled ion implantation process and a normal to a surface of the substrate is 10° to 25°.

4. The method of claim 3, wherein the third ions are N-type impurity ions and the fourth ions are P-type impurity ions.

5. The method of claim 1, wherein the first ions comprise at least one of:
   germanium ions,
   silicon ions,
   fluorinions, or
   antimony ions.

6. The method of claim 1, wherein the second ions comprise at least one of:
   carbon ions,
   nitrogen ions, or
   fluorinions.

7. The method of claim 1, wherein:
   the first ions are implanted at energy greater than or equal to 6 kilo electronvolts and less than or equal to 14 kilo electronvolts, and
   an implanted dosage of the first ions is greater than or equal to $1*10^{14}$ atom/cm$^2$ and less than or equal to $5*10^{14}$ atom/cm$^2$.

8. The method of claim 1, wherein:
   the second ions are implanted at energy greater than or equal to 2 kilo electronvolts and less than or equal to 4 kilo electronvolts, and
   an implanted dosage of the second ions is greater than or equal to $1*10^{14}$ atom/cm$^2$ and less than or equal to $5*10^{14}$ atom/cm$^2$.

9. The method of claim 1, further comprising:
   forming an inter-layer dielectric layer on the substrate;
   performing an etching process on the inter-layer dielectric layer to form a source contact hole that exposes part of the heavily-doped source region and a drain contact hole that exposes part of the heavily-doped drain region respectively; and
   forming a source contact structure in the source contact hole and forming a drain contact structure in the drain contact hole.

10. The method of claim 9, wherein the forming a source contact structure in the source contact hole and forming a drain contact structure in the drain contact hole comprises:
    forming a source metal silicide in the source contact hole and forming a drain metal silicide in the drain contact hole; and
    forming the source contact structure on the source metal silicide and forming the drain contact structure on the drain metal silicide.

* * * * *